United States Patent
Shim et al.

(10) Patent No.: US 8,409,726 B2
(45) Date of Patent: Apr. 2, 2013

(54) PRINTED CIRCUIT BOARD WITH MULTIPLE METALLIC LAYERS AND METHOD OF MANUFACTURING THE SAME

(75) Inventors: Chang-han Shim, Changwon (KR); Sung-il Kang, Changwon (KR); Se-chuel Park, Changwon (KR)

(73) Assignee: Samsung Techwin Co., Ltd., Changwon (KR)

( * ) Notice: Subject to any disclaimer, the term of this patent is extended or adjusted under 35 U.S.C. 154(b) by 550 days.

(21) Appl. No.: 12/475,764

(22) Filed: Jun. 1, 2009

(65) Prior Publication Data

US 2010/0116528 A1    May 13, 2010

(30) Foreign Application Priority Data

Nov. 13, 2008    (KR) .................. 10-2008-0112865

(51) Int. Cl.
 *B32B 15/20*    (2006.01)
(52) U.S. Cl. ........ 428/675; 428/209; 428/618; 428/668; 428/669; 428/680; 361/751
(58) Field of Classification Search .................. 428/209, 428/901, 607, 618, 668, 669, 675, 680; 361/751
See application file for complete search history.

(56) References Cited

U.S. PATENT DOCUMENTS

| | | | |
|---|---|---|---|
| 3,884,771 A * | 5/1975 | Hanabusa et al. ............... 205/76 |
| 4,049,481 A * | 9/1977 | Morisaki ....................... 156/151 |
| 4,101,402 A * | 7/1978 | Vossen et al. ............ 204/192.14 |
| 4,640,747 A * | 2/1987 | Ueno et al. ..................... 156/151 |
| 4,935,310 A * | 6/1990 | Nakatsugawa ................ 428/607 |
| 5,242,861 A * | 9/1993 | Inaba ............................. 438/627 |
| 5,243,320 A * | 9/1993 | Clouser et al. ................ 338/308 |
| 5,403,672 A * | 4/1995 | Urasaki et al. ................ 428/607 |
| 5,767,008 A * | 6/1998 | Haji .............................. 438/612 |
| 5,800,930 A * | 9/1998 | Chen et al. .................... 428/607 |
| 6,171,714 B1 * | 1/2001 | Bergkessel et al. ........... 428/618 |
| 6,331,347 B2 * | 12/2001 | Haji .............................. 428/209 |
| 6,359,233 B1 * | 3/2002 | Joy et al. ....................... 174/255 |
| 6,497,806 B1 * | 12/2002 | Endo ............................. 205/111 |
| 6,771,160 B2 * | 8/2004 | Wang et al. ................... 338/308 |
| 6,939,622 B2 * | 9/2005 | Yoshihara et al. ............ 428/675 |

(Continued)

FOREIGN PATENT DOCUMENTS

JP    2005-353918 A    12/2005
KR    1020030039937 A    5/2003

(Continued)

OTHER PUBLICATIONS

Search Report established for JP 2009-258564 (Jul. 3, 2012).

*Primary Examiner* — Cathy Lam
(74) *Attorney, Agent, or Firm* — Drinker Biddle & Reath LLP

(57) ABSTRACT

Provided is a printed circuit board (PCB) with multiple metallic layers and a method of manufacturing the PCB to improve adhesion between a metal film and a polymer film, on which a circuit pattern is formed. The PCB includes: a first metal film; a polymer film formed on one surface of the first metal film; and a second metal film, interposed between the first metal film and the polymer film, having a first surface facing the first metal film and a second surface facing the polymer film, wherein the second surface is rougher than the first surface.

9 Claims, 3 Drawing Sheets

U.S. PATENT DOCUMENTS

| | | | |
|---|---|---|---|
| 6,989,199 B2 * | 1/2006 | Yamamoto et al. | 428/607 |
| 6,994,918 B2 * | 2/2006 | Johnson | 428/618 |
| 7,026,059 B2 * | 4/2006 | Suzuki et al. | 428/626 |
| 7,108,923 B1 * | 9/2006 | Ito et al. | 428/675 |
| 7,223,481 B2 * | 5/2007 | Suzuki et al. | 428/612 |
| 7,691,487 B2 * | 4/2010 | Nagatani | 428/607 |

FOREIGN PATENT DOCUMENTS

| | | |
|---|---|---|
| KR | 1020060109122 A | 10/2006 |

* cited by examiner

PRINTED CIRCUIT BOARD WITH MULTIPLE METALLIC LAYERS AND METHOD OF MANUFACTURING THE SAME

CROSS-REFERENCE TO RELATED PATENT APPLICATION

This application claims the benefit of Korean Patent Application No. 10-2008-0112865, filed on Nov. 13, 2008, in the Korean Intellectual Property Office, the disclosure of which is incorporated herein in its entirety by reference.

BACKGROUND OF THE INVENTION

1. Field of the Invention

The present invention relates to a printed circuit board (PCB) and a method of manufacturing the PCB and more particularly, to a PCB having improved adhesion between a metal thin film and a resin material, and a method of manufacturing the PCB.

2. Description of the Related Art

Printed circuit boards (PCB) are essential in various electronic and machine equipments.

The PCB is formed by attaching a copper foil onto one side or both sides of a polymer insulating board formed of epoxy or polyimide, and circuits are formed on the copper foil by etching or plating.

Various attempts at improving adhesion between the copper foil and the polymer insulating board have been developed.

One method of improving adhesion includes strengthening adhesion between a polymer resin and the copper foil by coating the surface of the copper foil with a polar polymer. However, since such a method depends on chemical coupling, there is a limit to how much the adhesion is improved. In addition, in a cross-linking process performed on the polar polymers at a high temperature, internal pressure is generated as organic compounds evaporate, thereby forming defects, such as bubbles.

Another method involves physically or chemically forming nodules on the surface of the copper foil, thereby improving adhesion between the copper foil and the polymer resin through an uneven surface-structure of nodules. Widely used methods of forming nodules on the surface of the copper foil include jet scrubbing, brush grinding, and soft etching. However, in the soft etching, since the nodules have a thickness of about 1-2 μm, the circuit has a non-uniform width and etching linearity deteriorates. Also, after the nodules are formed, an oxide film is formed on the surface of the copper foil so that a process of removing the oxide film is needed.

SUMMARY OF THE INVENTION

The present invention provides a printed circuit board (PCB) having improved adhesion between a polymer film and a metal thin film on which a circuit pattern is formed, and a method of manufacturing the PCB.

According to an aspect of the present invention, there is provided a printed circuit board (PCB) including: a first metal film; a polymer film formed on one surface of the first metal film; and a second metal film, interposed between the first metal film and the polymer film, having a first surface facing the first metal film and a second surface facing the polymer film, wherein the second surface is rougher than the first surface.

The first metal film may be formed of copper or a copper alloy.

The second metal film may be formed of nickel or a nickel alloy.

The PCB may further include a third metal film interposed between the polymer film and the second surface.

The third metal film may be formed of nickel, palladium, gold, or an alloy thereof.

According to another aspect of the present invention, there is provided a method of manufacturing a printed circuit board (PCB), the method including: preparing a first metal film; forming a second metal film on one surface of the first metal film using electroplating, the second metal film having a first surface contacting the first metal film and a second surface opposite to the first surface, wherein the second surface is rougher than the first surface; and forming a polymer film on the second surface of the second metal film.

The first metal film may be formed of copper or a copper alloy.

The second metal film may be formed of nickel or a nickel alloy.

The electroplating may be performed for 3-20 seconds at a current density of 10 A/dm$^2$ or greater.

In the forming of the second metal film by using electroplating, a plating bath including 2.5-3.5 g/l of nickel sulfate or nickel chloride may be used.

The method may further include forming a third metal film on the second surface of the second metal film before the forming of the polymer film, wherein the polymer film is formed on the third metal film.

The third metal film may be formed of nickel, palladium, gold, or an alloy thereof.

In accordance with an embodiment of the method of the present invention, the second layer is formed on the first layer before a polymer is laid down.

According to the present invention, the adhesion between the first metal film and the polymer film may be improved due to a simplified manufacturing process.

Also, the diffusion preventing layer is formed so that reliability and adhesion at a high-temperature and in a hygroscopic environment may be improved.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, the present invention will be described more fully with reference to the accompanying drawings, in which exemplary embodiments of the invention are shown.

Figure 1:
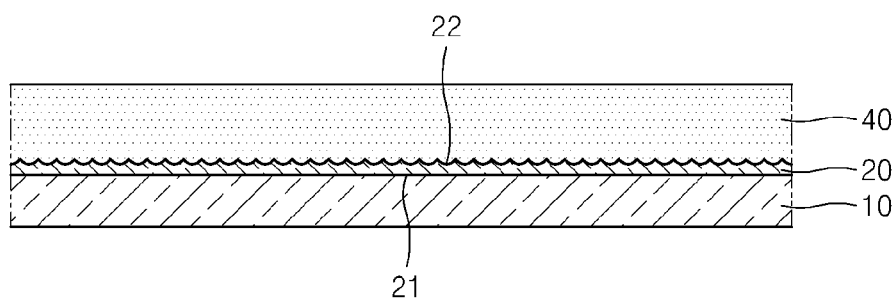
FIG. 1 is a cross-sectional diagram of a printed circuit board (PCB) according to an embodiment of the present invention.

FIG. 1 is a cross-sectional diagram of a printed circuit board (PCB) according to an embodiment of the present invention.

Referring to FIG. 1, the PCB according to the present embodiment includes a first metal film 10, a second metal film 20, and a polymer film 40.

The first metal film 10 is formed of copper or a copper alloy and corresponds to a conductive layer, on which a circuit pattern is formed.

The polymer film 40, formed of polyimide or acrylic resin, is formed to face the first metal film 10.

The second metal film 20 is interposed between the first metal film 10 and the polymer film 40 and is formed of nickel or a nickel alloy.

The second metal film 20 includes a first surface 21 facing the first metal film 10 and a second surface 22 facing the polymer film 40.

The second metal film 20 may be formed on the first metal film 10 using electroplating. Here, the surface of the second surface 22 may be rougher than the surface of the first surface 21.

The polymer film 40 is formed on the second surface 22 of the second metal film 20 so as to cover the second surface 22.

Since the second surface 22 contacting the polymer film 40 is rough, adhesion between the polymer film 40 and the second metal film 20 is improved. In addition, the second metal film 20 closely adheres to the first metal film 10 due to the electroplating so that adhesion between the first metal film 10 and the polymer film 40 may be improved by the second metal film 20.

Accordingly, since the second metal film 20 having the rough surface is formed on the first metal film 10, the adhesion between the polymer film 40 and the first metal film 10 may be simply improved.

The PCB described above is manufactured as follows.

Firstly, the first metal film 10 formed of copper or a copper alloy is prepared.

Then, the second metal film 20 is formed on one side of the first metal film 10, that is, the upper surface of the metal thin film 10 as viewed in FIG. 1, by using electroplating. Here, the second metal film 20 is formed to be a rough plating layer. Thus, as described above, the second surface 22 formed opposite to the first surface 21 contacting the first metal film 10 is electroplated to be rough.

Here, the second metal film 20 may be formed of nickel or a nickel alloy.

The composition of a nickel plating bath for forming a rough plating layer as in the second metal film 20 may include 2.5-3.5 g/l of nickel sulfate or nickel chloride, 2.5-3.0 g/l of ammonium sulfate, 4.5-5.0 g/l of sodium sulfate, 1.5-2.0 g/l of sodium chloride, and 2.0-3.0 g/l of boric acid. In the composition of the plating bath for forming the rough plating layer as in the second metal film 20, nickel sulfate or nickel chloride may have a low concentration of 10% or less of the composition of the plating bath for forming a general nickel plating layer.

Also, electricity flows in the low concentrated plating bath with a higher current density than when conventionally forming a general nickel plating layer so that crystal growth of nickel may rapidly have a rough surface at a low density.

More specifically, a high current density of 10 ASD (A/dm$^2$) or greater is applied to the plating bath with the composition described above so that the second metal film 20, which is a nickel plating layer having a rough surface, is formed. Also, the plating process may be a reel-to-reel type which provides the first metal film 10, rolled to one side of a roller, to the plating bath, the first metal film 10 being rolled to the other side of the roller after plating is completed. In order to increase the speed of nickel plating and to stably obtain a rough nickel plating layer, a high current density of 50 ASD may be applied. A plating process time may take 3-20 seconds. During a plating process time of 3 seconds or below, growth of nickel crystal does not occur. When the plating process time is 20 seconds or greater, secondary contamination such as smut may occur on the rough nickel plating layer due to excessive growth of nickel crystal.

The second metal film 20 formed of the rough nickel plating layer may have a thickness of 0.1-0.5 μm. When the second metal film 20 has a thickness of 0.1 μm or below, efficiency of the rough plating layer may be low and when the second metal film 20 has a thickness of 0.5 μm or greater, the plating layer may be exfoliated due to excessive growth of nickel plating. That is, growth of nickel in a vertical direction is insignificant in a plating layer having a thickness of 0.1 μm or below and the plating layer having a thickness of 0.5 μm or greater may be separated due to excessive growth in a vertical direction.

Figure 7:
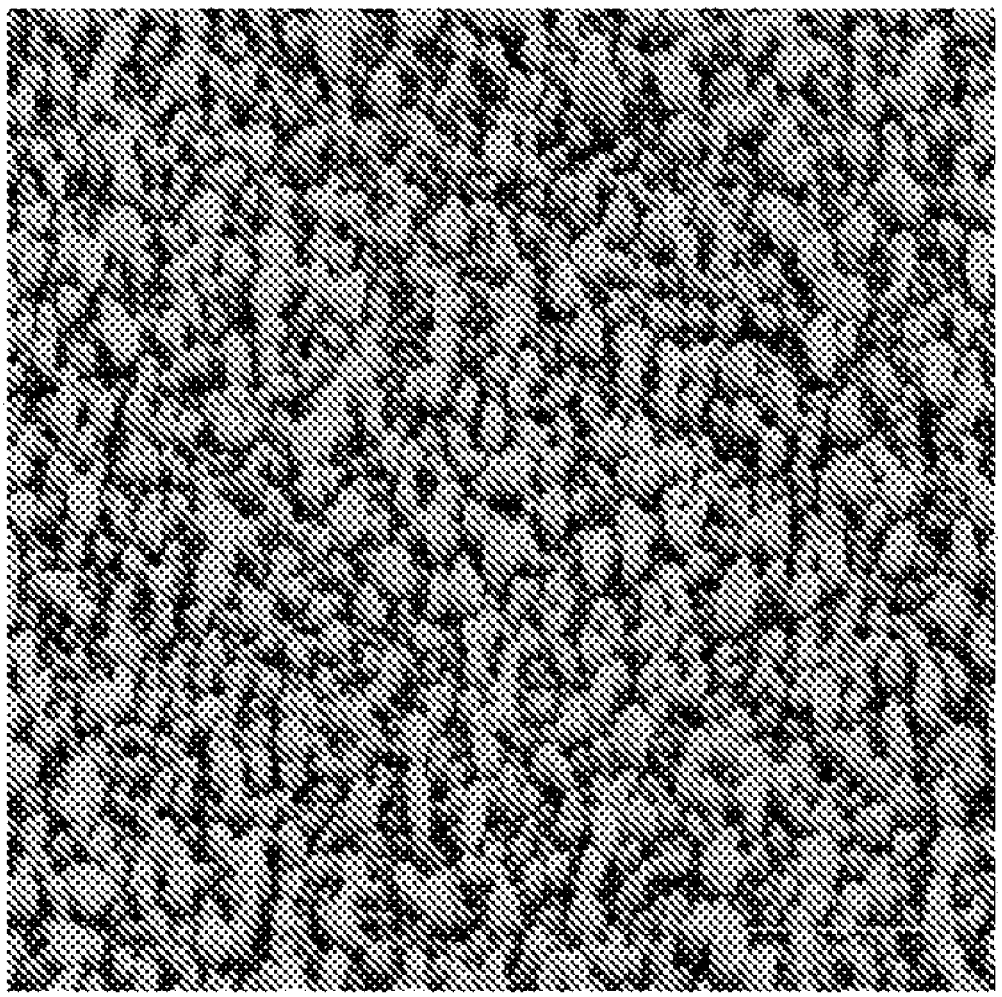
FIG. 7 is a scanning electron microscope (SEM) photograph of a second surface.

FIG. 7 is a scanning electron microscope (SEM) photograph of the second surface 22 of the second metal film 20 included in the PCB according to an embodiment of the present invention. As illustrated in FIG. 7, since the surface of the second surface 22 is rough, adhesion between the second surface 22 and a polymer resin, which naturally occurs due to surface roughness, is added after the polymer resin is attached to the second surface 22 when forming the polymer film 40, thereby improving adhesion between the polymer film 40 and the second metal film 20.

After the second metal film 20 is manufactured, whether the second surface 22 has a desired surface roughness may be examined by a scanning electron microscope (SEM). However, time for the examination is needed, and thus, methods of rapidly identifying surface roughness during the process are needed.

Accordingly, gloss testing may be used. That is, when the gloss of the second surface 22 is in the range of about 0.2 to 0.8, it is regarded that the second metal film 20 having a desired surface roughness is manufactured. In a gloss of 0.2 or below, roughness is excessively achieved so that the polymer resin forming the polymer film 40 may run over during the forming of the polymer film 40 and a secondary quality problem such as resin bleed overflow (RBO) may be generated. In gloss of 0.8 or greater, roughness is not sufficiently achieved and thus a moisture sensitivity level (MSL) is not improved.

After the second metal film 20 is formed, a precursor of a polyimide monomer is cast on the second surface 22 of the second metal film 20 and then, the polymer film 40 formed of polyimide may be formed by cross-linking at a high temperature.

In conventional chip on film (COF) manufacturing, a seed layer such as nickel or chrome is formed on a polyimide film using sputtering and then is copper plated, thereby forming a copper foil. However, in the present embodiment, the second metal film 20 having a rough surface is firstly formed on the copper foil, that is, the first metal film 10 by electroplating and then, the polymer film 40 is formed on the second metal film 20 as described above. Thus, the adhesion between the metal thin film 10 and the polymer film 40 may be improved, and productivity and manufacturing costs may be improved due to a simplified manufacturing process.

Figure 2:
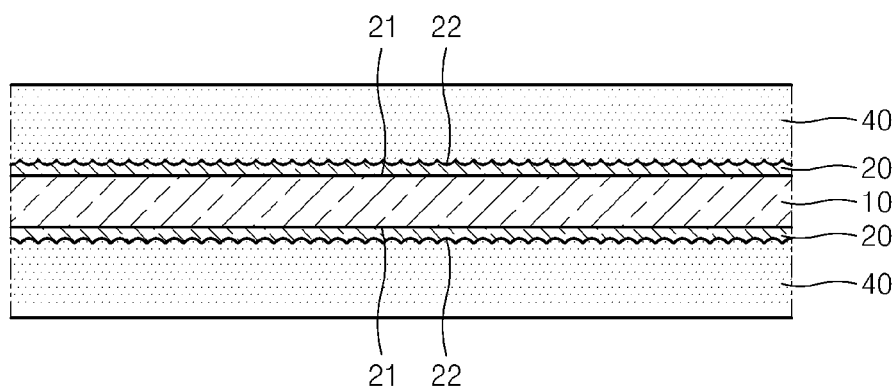
FIG. 2 is a cross-sectional diagram of a PCB according to another embodiment of the present invention.

As illustrated in FIG. 2, the second metal film 20 and the polymer film 40 are sequentially formed on both surfaces of the first metal film 10 using the process described above so that the PCB may be formed using films in which the outer surfaces are insulated.

Figure 3:
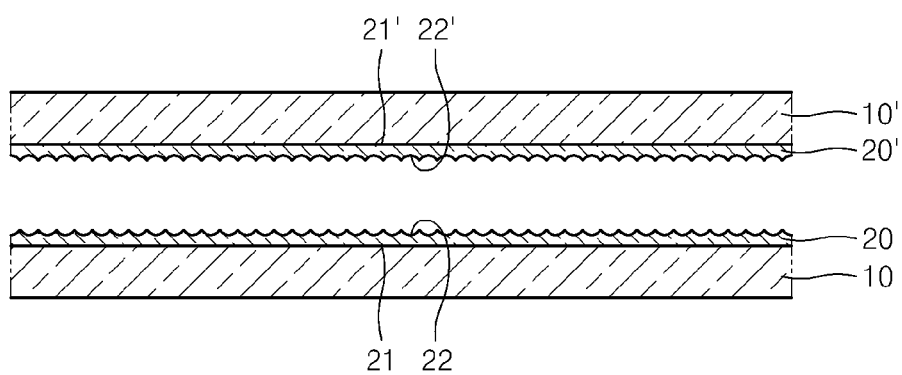
FIGS. 3 and 4 are cross-sectional diagrams illustrating a method of manufacturing a PCB according to another embodiment of the present invention.
Figure 4:
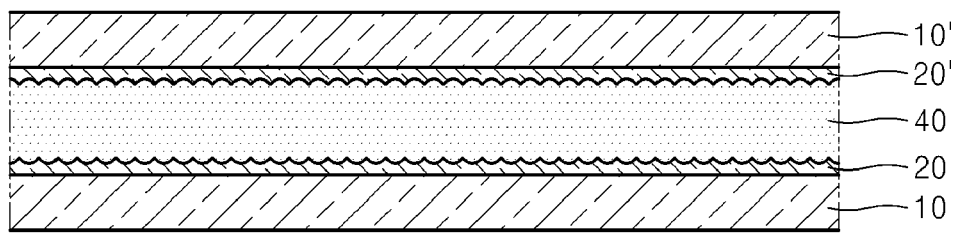

FIGS. 3 and 4 are cross-sectional diagrams illustrating a method of manufacturing a PCB according to another embodiment of the present invention.

As in FIG. 3, second metal films 20 and 20' are respectively formed on the surfaces of first metal film 10 and 10' by using rough plating and then, second surfaces 22 and 22' of the second metal films 20 and 20' are disposed to face each other.

Then, as in FIG. 4, a precursor of a polyimide monomer is cast between the second surfaces 22 and 22', which face each other, and the polymer film 40 formed of polyimide is formed by cross-linking at a high temperature.

In this case, while the polymer film 40 is disposed at the center, the first metal films 10 and 10' for forming a circuit pattern may be disposed on both sides of the polymer film 40.

Figure 5:
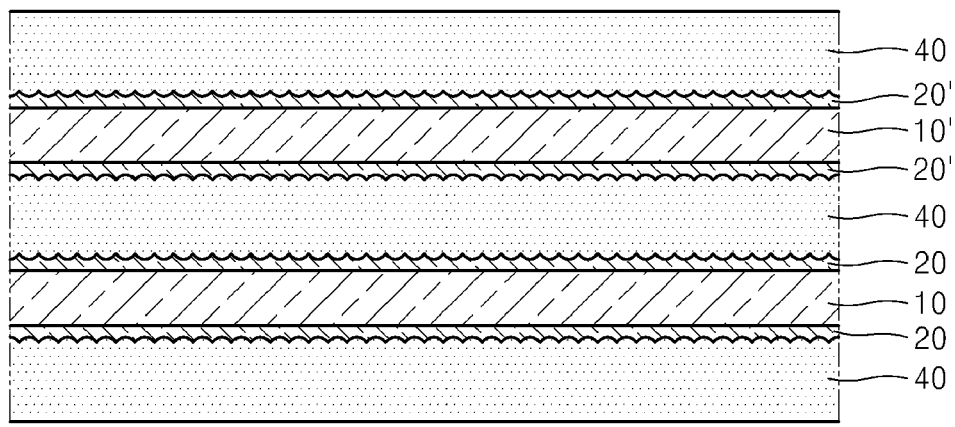
FIG. 5 is a cross-sectional diagram of a PCB according to another embodiment of the present invention.

Also, in the present embodiment, the second metal films 20 and 20' are respectively plated on both sides of the first metal films 10 and 10' and then the polymer film 40 is formed on the second metal films 20 and 20' as in FIG. 2. Thus, as illustrated in FIG. 5, while the polymer film 40 is disposed at the center, the first metal films 10 and 10' for forming a circuit pattern are disposed on both sides of the polymer film 40 and then the polymer films 40 may be formed to cover the outer surfaces of the first metal films 10 and 10', thereby manufacturing a multi-layered PCB.

Figure 6:
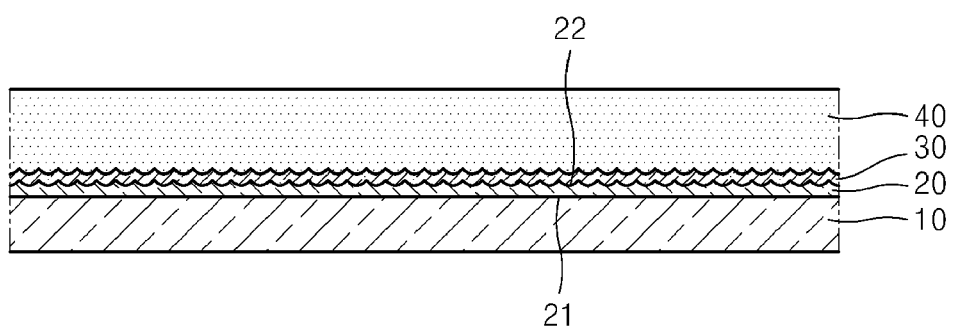
FIG. 6 is a cross-sectional diagram of a PCB according to another embodiment of the present invention.

FIG. 6 is a cross-sectional diagram of a PCB according to another embodiment of the present invention.

Referring to FIG. 6, the second metal film 20 is formed on one surface of the first metal film 10 using rough plating as in FIG. 1 and then, a third metal film 30 is formed on the second surface 22 of the second metal film 20. Then, the polymer film 40 is formed on the third metal film 30.

The third metal film 30 may be formed of nickel (Ni), palladium (Pd), gold (Au), or an alloy thereof and may function as a diffusion preventing layer for preventing a metal component of the first metal film 10 from being diffused in the polymer film 40 during forming of the polymer film 40, that is, for preventing the metal component of the first metal film 10 from being diffused in the interface between the polymer film 40 and the second metal film 20 and thereby, preventing adhesion between the polymer film 40 and the second metal film 20 from deteriorating. In other words, since the third metal film 30 is interposed between the polymer film 40 and the second metal film 20, a metal component of the first metal film 10 is prevented from being diffused so that reliability and adhesion at a high-temperature and in a hygroscopic environment may be improved.

The third metal film 30 is not formed by the rough plating as in the second metal film 20. Instead, the third metal film 30 may be formed using a conventional plating process. Accordingly, a plating bath with a higher density than that of the plating bath for forming the second metal film 20 is used to form the third metal film 30 and the third metal film 30 is plated at a low current density.

Since the third metal film 30 is formed on the second surface 22 having the rough surface, the third metal film 30 may be formed to be thin so that roughness of the second surface 22 is applied to the third metal film 30.

The third metal film 30 may have a thickness of 0.1-0.5 μm. When the third metal film 30 has a thickness of 0.1 μm or below, the third metal film 30 may not function as a diffusion preventing layer. When the third metal film 30 has a thickness of 0.5 μm or greater, the rough surface is not formed on the third metal film 30, thereby decreasing the adhesion between the third metal film 30 and the polymer film 40.

As in FIG. 6, the third metal film 30 may be formed as a single layer. However, the present invention is not limited thereto and the third metal film 30 may be formed as multiple layers.

The third metal film 30 may be also formed in the PCB illustrated in FIGS. 2-5.

Experimental Example

A first metal film formed of a copper alloy is prepared.

A current density of 20 ASD flows in a plating bath including 3.5 g/l of nickel sulfate, 2.75 g/l of ammonium sulfate, 4.75 g/l of sodium sulfate, 1.75 g/l of sodium chloride, and 2.5 g/l of boric acid, and the first metal film is filled in the plating bath so as to be plated for 20 seconds.

As illustrated in FIG. 7, a second surface of a second metal film formed in the plating bath is rough enough that adhesion between the second surface and a polymer film may be improved.

A precursor of a polyimide monomer is cast on the second surface of the second metal film and then, is cross-linked at a temperature of 450° C., thereby forming the polymer film.

According to the present invention, hard PCBs and soft PCBs used in various electric, mechanical, and electronic equipments may be manufactured. More specifically, the method of manufacturing the PCB according to the present invention may be useful in manufacturing casting type flexible copper clad laminates (FCCL), in which fine pitch patterned circuits are formed by etching.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A printed circuit board (PCB) comprising:
   a first metal film where a circuit pattern is formed;
   a polymer film formed on one surface of the first metal film; and
   a second metal film, interposed between the first metal film and the polymer film, having a first surface facing the first metal film and a second surface facing the polymer film, wherein the second surface is rougher than the first surface, wherein the second metal film is formed of pure nickel.

2. The PCB of claim 1, wherein the first metal film is formed of copper or a copper alloy.

3. The PCB of claim 1, further comprising a third metal film interposed between the polymer film and the second surface.

4. The PCB of claim 3, wherein the third metal film is formed of nickel, palladium, gold, or an alloy of nickel, palladium or gold.

5. The PCB of claim 1, wherein the second metal film is formed on the first metal film before the polymer film is formed on the one surface of the first metal film.

6. The PCB of claim 1, wherein the second surface has a roughness in a range between 0.2 and 0.8 gloss units.

7. The PCB of claim 1, wherein the second metal film has a thickness in a range between 0.1 and 0.5 microns.

8. A printed circuit board (PCB) comprising:
   a first metal film where a circuit pattern is formed;
   a polymer film formed on one surface of the first metal film;
   a second metal film, interposed between the first metal film and the polymer film, having a first surface facing the first metal film and a second surface facing the polymer film, wherein the second surface is rougher than the first surface, wherein the second metal film is formed of a nickel alloy; and a third metal film interposed between the polymer film and the second surface, wherein the third metal film is a solid metal layer.

9. A printed circuit board (PCB) comprising:

a first metal film where a circuit pattern is formed;

a polymer film formed on one surface of the first metal film;

a second metal film, interposed between the first metal film and the polymer film, having a first surface facing the first metal film and a second surface facing the polymer film, wherein the second surface is rougher than the first surface, wherein the second metal film is formed of a nickel alloy; and a third metal film interposed between the polymer film and the second surface, wherein the third metal film is formed of nickel, palladium, gold, or an alloy of nickel, palladium or gold.

* * * * *